(12) United States Patent
Gao et al.

(10) Patent No.: US 8,095,362 B2
(45) Date of Patent: *Jan. 10, 2012

(54) METHOD AND SYSTEM FOR REDUCING EFFECTS OF NOISE PRODUCING ARTIFACTS IN A SPEECH SIGNAL

(75) Inventors: Yang Gao, Mission Viejo, CA (US); Eyal Shlomot, Long Beach, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 683 days.

This patent is subject to a terminal disclaimer.

(21) Appl. No.: 12/284,805

(22) Filed: Sep. 24, 2008

(65) Prior Publication Data

US 2009/0070106 A1    Mar. 12, 2009

Related U.S. Application Data

(63) Continuation of application No. 11/385,553, filed on Mar. 20, 2006, now Pat. No. 7,454,335.

(51) Int. Cl.
*G10L 21/02* (2006.01)
*G10L 19/02* (2006.01)
(52) U.S. Cl. ...................................... 704/233
(58) Field of Classification Search .................. 704/233
See application file for complete search history.

(56) References Cited

U.S. PATENT DOCUMENTS

| 5,544,250 | A | 8/1996 | Urbanski |
| 5,550,924 | A | 8/1996 | Helf |
| 6,453,289 | B1 | 9/2002 | Ertem et al. |
| 7,454,335 | B2 * | 11/2008 | Gao et al. ............ 704/233 |
| 2004/0148166 | A1 | 7/2004 | Zheng |
| 2005/0177364 | A1 | 8/2005 | Jelinek |

OTHER PUBLICATIONS

Coding of Speech at 8kbit/s Using Conjugate-Structure Algebraic-Code-Excited Linear-Prediction (CS-ACELP), International Telecommunication Union, ITU-T Recommendation G.729, 1-35 (Mar. 1996).

* cited by examiner

*Primary Examiner* — Susan McFadden
(74) *Attorney, Agent, or Firm* — Farjami & Farjami LLP

(57) ABSTRACT

Methods and systems are presented for reducing effect of noise producing artifacts in a speech signal. An example method includes obtaining a plurality of incoming samples representative of a speech subframe, summing an energy level for each of the plurality of samples to generate a total input level, determining whether the speech subframe is in a silence area using the total input level, setting a gain value as a function of the total input level in response to the speech subframe being in the silence area, wherein the function results in the gain value increasing as the total input value increases and the gain value decreasing as the total input value decreases, multiplying the plurality of samples by the gain value to produce modified samples, generating a digital speech signal using the modified samples, and converting using a digital-to-analog converter, the digital speech signal into an analog signal.

34 Claims, 3 Drawing Sheets

METHOD AND SYSTEM FOR REDUCING EFFECTS OF NOISE PRODUCING ARTIFACTS IN A SPEECH SIGNAL

The present application is a Continuation of U.S. application Ser. No. 11/385,553, filed Mar. 20, 2006, now U.S. Pat No. 7,454,335.

BACKGROUND OF THE INVENTION

1. Field of the Invention

The present invention relates generally to speech coding. More particularly, the present invention relates to reduce effects of noise producing artifacts in a voice codec.

2. Background Art

Speech compression may be used to reduce the number of bits that represent the speech signal thereby reducing the bandwidth needed for transmission. However, speech compression may result in degradation of the quality of decompressed speech. In general, a higher bit rate will result in higher quality, while a lower bit rate will result in lower quality. However, modern speech compression techniques, such as coding techniques, can produce decompressed speech of relatively high quality at relatively low bit rates. In general, modern coding techniques attempt to represent the perceptually important features of the speech signal, without preserving the actual speech waveform. Speech compression systems, commonly called codecs, include an encoder and a decoder and may be used to reduce the bit rate of digital speech signals. Numerous algorithms have been developed for speech codecs that reduce the number of bits required to digitally encode the original speech while attempting to maintain high quality reconstructed speech.

FIG. 1 illustrates conventional speech decoding system 100, which includes excitation decoder 110, synthesis filter 120 and post-processor 130. As shown, decoding system 100 receives encoded speech bitstream 102 over a communication medium (not shown) from an encoder, where decoding system 100 may be part of a mobile communication device, a base station or other wireless or wireline communication device that is capable of receiving encoded speech bitstream 102. Decoding system 100 operates to decode encoded speech bitstream 102 and generate speech signal 132 in the form of a digital signal. Speech signal 132 may then be converted to an analog signal by a digital-to-analog converter (not shown). The analog output of the digital-to-analog converter may be received by a receiver (not shown) that may be a human ear, a magnetic tape recorder, or any other device capable of receiving an analog signal. Alternatively, a digital recording device, a speech recognition device, or any other device capable of receiving a digital signal may receive speech signal 132.

Excitation decoder 110 decodes encoded speech bitstream 102 according to the coding algorithm and bit rate of encoded speech bitstream 102, and generates decoded excitation 112. Synthesis filter 120 may be a short-term prediction filter that generates synthesized speech 122 based on decoded excitation 112. Post-processor 130 may include filtering, signal enhancement, noise reduction, amplification, tilt correction and other similar techniques capable of improving the perceptual quality of synthesized speech 122. Post-processor 130 may decrease the audible noise without noticeably degrading synthesized speech 122. Decreasing the audible noise may be accomplished by emphasizing the formant structure of synthesized speech 122 or by suppressing the noise in the frequency regions that are perceptually not relevant for synthesized speech 122.

In variable-rate speech coders, perceptually important parts of speech (e.g., voiced speech, plosives, or voiced onsets) are coded with a higher number of bits, and less important parts of speech (e.g., unvoiced parts or silence between words) are coded with a lower number of bits. Noise suppression improves the quality of the reconstructed voice signal and helps variable-rate speech coders distinguish voice parts from noise parts. Noise suppression also helps low bit-rate speech encoders produce higher quality output by improving the perceptual speech quality. Typically, noise suppression techniques remove noise by spectral subtraction methods in the frequency domain. A voice activity detector (VAD) determines in the time-domain whether a frame of the signal includes speech or noise. The noise frames are analyzed in the frequency-domain to determine characteristics of the noise signal. From these characteristics, the spectra from noise frames are subtracted from the spectra of the speech frames, providing a clean speech signal in the speech frames.

Also, time-domain noise attenuation may be applied to improve the quality of a speech signal. For example, in a speech coding system with time-domain noise attenuation, described in U.S. application Ser. No. 09/782,791, filed Feb. 13, 2001, which is hereby incorporated by reference in its entirety, the gains from linear prediction speech coding are adjusted by a gain factor to suppress background noise. As described therein, the speech coding system uses frequency-domain noise suppression along with time-domain voice attenuation to further reduce the background noise. After an analog signal is converted into a digitized signal, a preprocessor suppresses noise in the digitized signal using a VAD and frequency-domain noise suppression. When the VAD identifies a frame associated with only noise (no speech), a windowed frame including the identified frame of about 10 ms is transformed into the frequency domain. Spectral magnitudes of the noisy speech signal are then modified to reduce the noise level according to an estimated SNR, and the modified spectral magnitudes are combined with the unmodified spectral phases. The modified spectrum is then transformed back to the time-domain. An analysis-by-synthesis scheme chooses the best representation for several parameters such as an adjusted fixed-codebook gain, a fixed codebook index, a lag parameter, and the adjusted gain parameter of the long-term predictor. The gains may be adjusted by a gain factor prior to quantization. The gain factor $G_f$ may suppress the background noise in the time domain while maintaining the speech signal, where $G_f$ is defined by $G_f=1-C.NSR$, where NSR is the frame-based noise-to-signal ratio, and C is a constant in the range of 0 through 1 and controls the degree of noise reduction. NSR has a value of about 1 when only background noise is detected in the frame, and when speech is detected in the frame, NSR is the square root of the background noise energy divided by the signal energy in the frame.

However, the existing approaches do not properly address reducing effects of noise producing artifacts in the silence areas of a speech signal, and especially when a VAD is not available. In silence areas, sample values are quite small and their quantization errors are relatively very large. The effects of these errors are further exacerbated by the fixed-point implementation of a speech coding algorithm with its accuracy limited by use of integer values, which results in the relative quantization errors of the silence areas to become much larger, which causes a higher output energy compared to the original silence input energy, and more audible noise.

Accordingly, there is an intense need in the art for low-complexity speech coding methods and systems that can effectively reduce effects of artifacts in a speech signal, and especially in silence areas of the speech signal and/or without utilizing a VAD.

SUMMARY OF THE INVENTION

The present invention is directed to a method of reducing effect of noise producing artifacts in silence areas of a speech signal for use by a speech decoding system. In one aspect, the method comprises obtaining a plurality of incoming samples of a speech subframe; summing an absolute value of an energy level for each of the plurality of incoming samples to generate a total input level (gain_in); smoothing the total input level to generate a smoothed level (Level_in_sm); determining that the speech subframe is in a silence area based on the total input level, the smoothed level and a spectral tilt parameter; defining a gain using k1*(Level_in_sm/1024)+(1−k1), where K1 is a function of the spectral tilt parameter; and modifying an energy level of the speech subframe using the gain.

In a further aspect, the smoothing is performed using (Level_in_sm=0.75*Level_in_sm+0.25*gain_in), and the determining is performed using (Level_in_sm<1024) && gain_in<2*Level_in_sm) && (oarcor0<512/32768).

In another aspect, the method further comprises assigning Level_in_sm to gain_in (gain_in=Level_in_sm) if Level_in_sm<gain_in. Yet, in another aspect, the method also comprises summing an absolute value of an energy level for each of the plurality of outgoing samples, prior to the modifying, to generate a total output level (gain_out); determining an initial gain using (gain_in/gain_out); and modifying the gain using the initial gain to generate a modified gain (g0), where the modifying comprises multiplying sig_out for each of the plurality of outgoing samples by a smoothed gain (g_sm), wherein g_sm is obtained using iterations from 0 to n−1 of (previous g_sm*0.95+g0*0.05), where n is the number of samples, and previous g_sm is zero (0) prior to the first iteration.

In a separate aspect, there is provided a method of reducing effect of noise producing artifacts in a speech signal. The method comprises obtaining a plurality of incoming samples representative of a speech subframe; summing an energy level for each of the plurality of samples to generate a total input level; comparing the total input level with a predetermined threshold; setting a gain value as a function of the total input level, wherein the gain value is between zero (0) and one (1), and wherein the function results in a lower gain value when the total input level is indicative of a silence area than when the total input level is indicative of a non-silence area; multiplying the plurality of samples representative of the speech subframe by the gain value.

In a related aspect, the setting divides the total input level by the predetermined threshold if the total input level is not greater than the predetermined threshold, and the setting sets the gain value to one (1) if the total input level is greater than the predetermined threshold.

In a further aspect, the summing sums an absolute value of the energy level for each of the plurality of samples to generate the total input level.

In one aspect, the method is performed by a speech decoding system. Yet, in another aspect, the method is performed by a speech encoding system.

In an additional aspect, the method further comprises determining whether the speech signal is a narrowband signal or a wideband signal; and performing the obtaining, the summing, the comparing, the setting and the multiplying only if the determining determines that the speech signal is the narrowband signal.

Yet, in another additional aspect, the method further comprises detecting a transition of the speech signal between a narrowband signal and a wideband signal; and gradually changing the gain value based on the transition.

Other features and advantages of the present invention will become more readily apparent to those of ordinary skill in the art after reviewing the following detailed description and accompanying drawings.

BRIEF DESCRIPTION OF THE DRAWINGS

The features and advantages of the present invention will become more readily apparent to those ordinarily skilled in the art after reviewing the following detailed description and accompanying drawings, wherein.

DETAILED DESCRIPTION OF THE INVENTION

Figure 1:
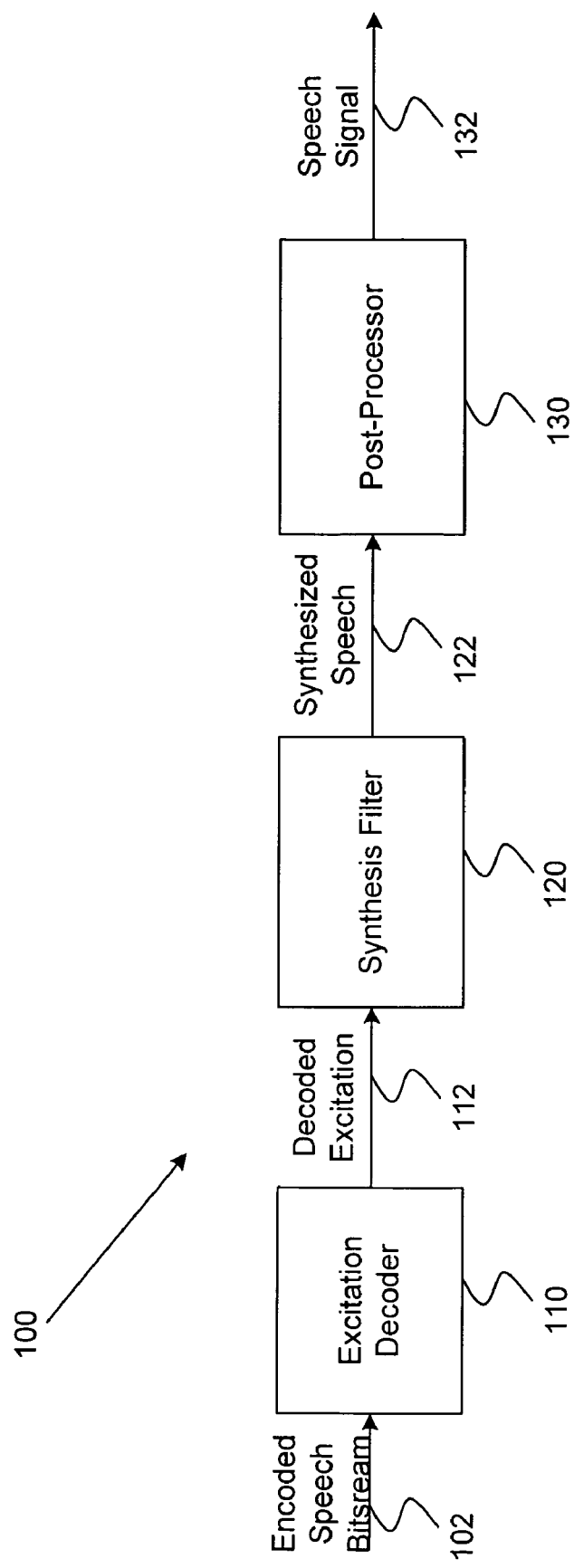
FIG. 1 illustrates a block diagram of a conventional decoding system for decoding and post-processing of encoded speech bitstream.

Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings. It should be borne in mind that, unless noted otherwise, like or corresponding elements among the figures may be indicated by like or corresponding reference numerals.

Figure 2:
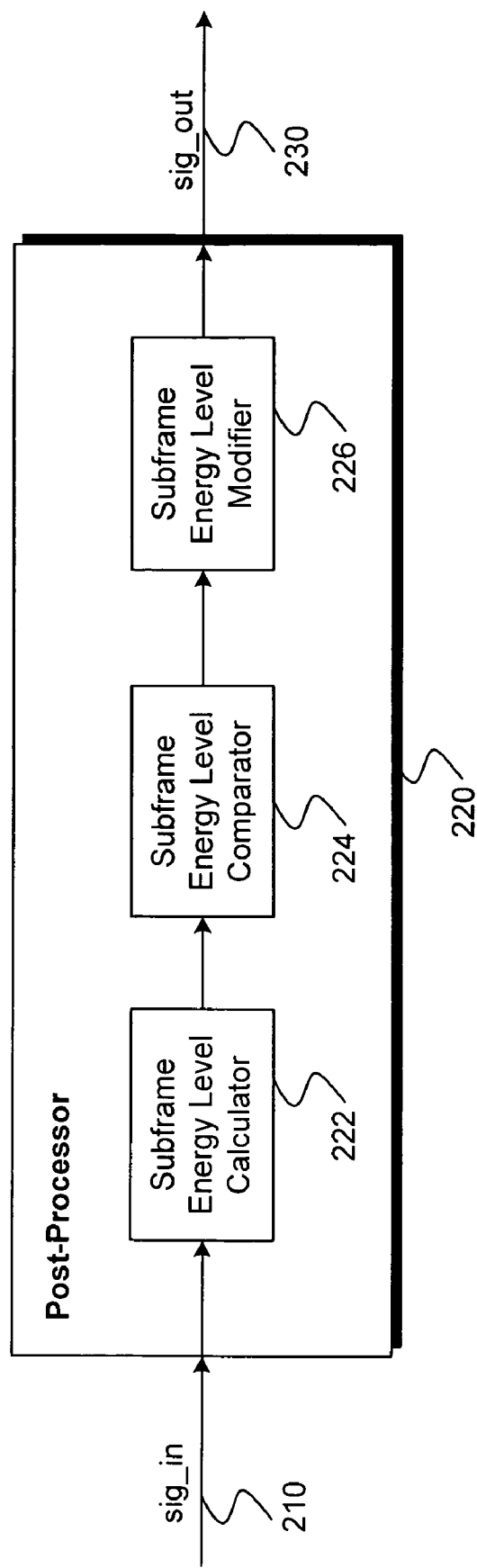
FIG. 2 illustrates a block diagram of a speech post-processor, according to one embodiment of the present application.
Figure 3:
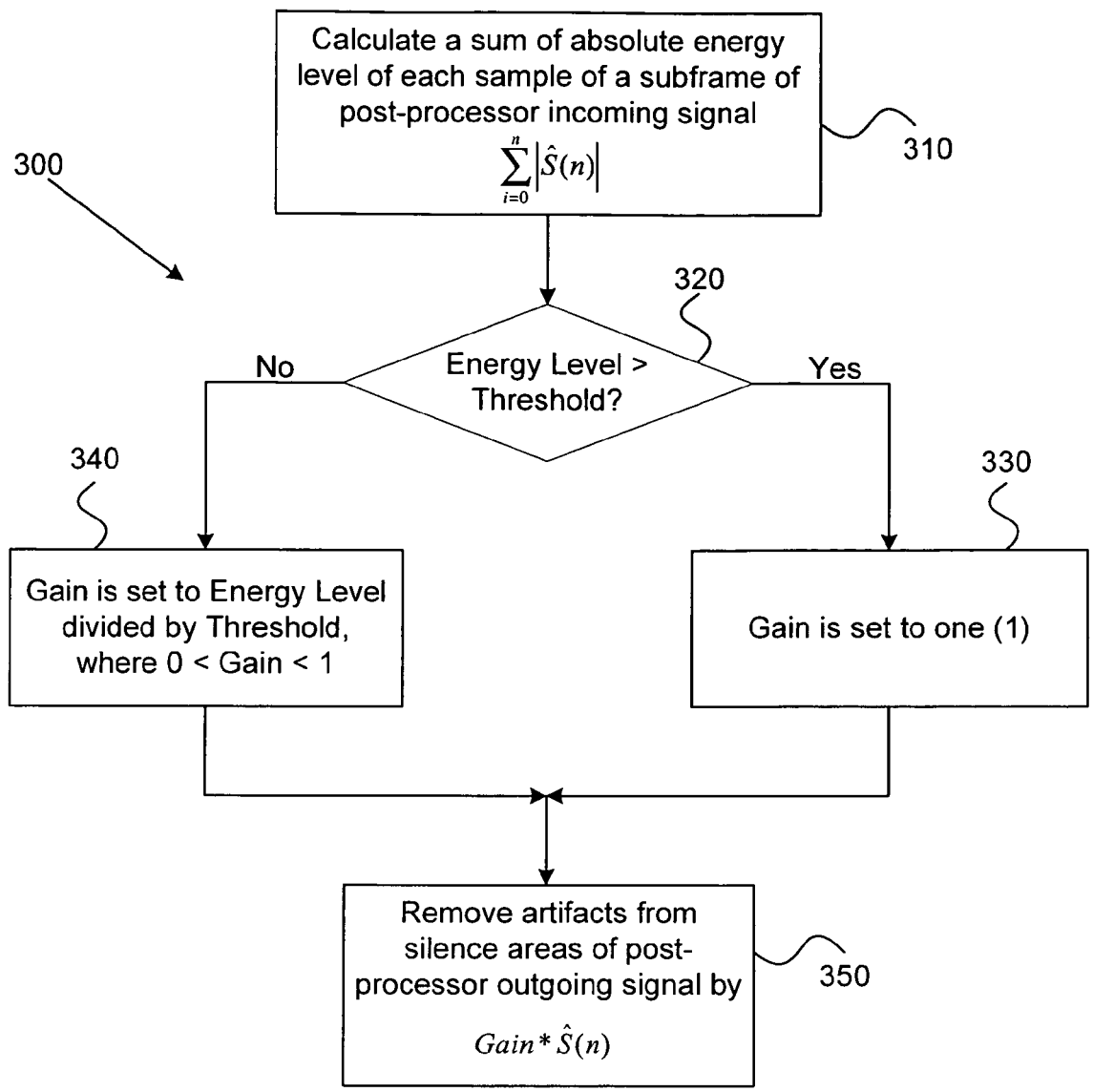
FIG. 3 illustrates a flow diagram of a post-processing method for use by the speech post-processor of FIG. 2, according to one embodiment of the present application.

FIG. 2 illustrates a block diagram of speech post-processor 220, according to one embodiment of the present application. As shown, speech post-processor 220 receives incoming signal (sig_in) 210 and generates outgoing signal (sig_out) 230 after post-processing of sig_in 210 to reduce the audible effects of artifacts in the silence areas of sig_in 210. With reference to FIG. 3, which illustrates an example flow diagram of post-processing method 300 for use by speech post-processor 220, subframe energy level calculator 222 receives sig_in 210, at step 310, and calculates a sum of absolute energy level of each sample of a subframe of sig_in 210, which may be defined by:

$$L = \sum_{i=0}^{n} |\hat{S}(n)|,  \quad \text{Equation 1}$$

where L is the subframe energy level, $\hat{S}(n)$ designates sig_in 210, and (n) is the number of samples.

Next, subframe energy level comparator 224 receives the subframe energy level (L) from subframe energy level calculator 222, and at step 320, subframe energy level comparator 224 compares the subframe energy level (L) with a predetermined threshold (TH), e.g. 1,024, for a determination of whether the subframe energy level (L) is indicative of a silence area.

Output of subframe energy level comparator 224 is then received by subframe energy level modifier 226. If subframe energy level modifier 226 determines that the subframe energy level (L) is greater than the predetermined threshold (TH), at step 320, post-processing method 300 moves to step 330, which is indicative of non-silence area of speech. At step 330, a gain value (g) is set to one (1). On the other hand, if subframe energy level modifier 226 determines that the subframe energy level (L) is not greater than the predetermined threshold (TH), at step 320, post-processing method 300 moves to step 340, which is indicative of the silence area of speech. At step 340, the gain value (g) is set according to the result of the subframe energy level (L) divided by the predetermined threshold (TH), where 0<g<1, as shown below:

$$g = \begin{cases} 1 & L > TH \\ L/TH & L \leq TH. \end{cases}  \quad \text{Equation 2}$$

Next, post-processing method 300 moves to step 350, where subframe energy level modifier 226 modifies the subframe energy level (L), to reduced effects of artifacts in the silence areas of post-processor outgoing signal (sig_out) 230, for example, by multiplying the subframe energy level (L) by the predetermined threshold (TH), as shown in step 350, which is defined by:

$$g*\hat{S}(n)  \quad \text{Equation 3.}$$

In a preferred embodiment of the present invention, the embodiments of FIG. 2 and FIG. 3 are implemented in a speech decoder; however, in other embodiments, the present invention may also be implemented by an encoder. Further, although equation 2 shows that g is a function of L for silence areas, g may also be a function L in non-silence areas (L>TH) in other embodiments. For example, in the embodiments of FIG. 2 and FIG. 3, g is set to one (1) in non-silence areas (L>TH), such that $\hat{S}(n)$ remains unmodified after the operation of equation 3 in non-silence areas. In addition, although equation 2 shows that g is defined by the function of L/TH, other functions of L may be utilized by other embodiments.

Appendices A and B show an implementation of one embodiment of the present invention using "C" programming language in fixed-point and floating-point, respectively. In one embodiment, at the decoder side, the signal energy is reduced after detecting low level silence signal. For example, the signal level before speech post-processing may be defined as:

$$\text{gain\_in} = \sum_{i=0}^{Lsub-1} |\text{sig\_in}(i)|,  \quad \text{Equation 4}$$

where Lsub is the subframe size or the number of speech samples for each subframe, and sig_in( ) is the signal before performance of speech post-processing. Next, the smoothed level of sig_in is calculated by:

Level_in_sm=0.75*Level_in_sm+0.25*gain_in  Equation 5, where the initial value of Level_in_sm is zero (0). In one embodiment, equations 4 and 5 may be performed by subframe energy level calculator 222 of post-processor 200 in FIG. 2.

In such embodiment, the silence detection is based on the signal level and the spectral tilt parameter, which is also referred to as the first reflection coefficient (parcor0), as shown below:

Sil_Deci=(Level_in_sm<1024) &&
(gain_in<2*Level_in_sm) && (parcor0<512./32768);  Equation 6, where, Sil_Deci=1 is indicative of low level silence detection. In one embodiment, subframe energy level comparator 224 may determine Sil_Deci, according to equation 6.

Further, if the following condition is satisfied, gain_in (or the reference signal level) is replaced with the smoothed signal level, which may be performed by subframe energy level modifier 226:

if ((Sil_Deci=1) && (Level_in_sm<gain_in))

gain_in=Level_in_sm;  Equation 7.

Where, (Level_in_sm<gain_in) is indicative of non-existence of big peaks in the signal. Now, assuming sig_out(i), i=0, 1, . . . , Lsub−1, is the post-filtered signal before the gain adjustment discussed below, the initial post-filtered signal level may be calculated by subframe energy level calculator 222, as follows:

$$\text{gain\_out} = \sum_{i=0}^{Lsub-1} |\text{sig\_out}(i)|,  \quad \text{Equation 8}$$

where, the initial gain for adjusting the post-filtered signal energy can be determined by subframe energy level modifier 226 as:

$$g0 = \frac{\text{gain\_in}}{\text{gain\_out}}.  \quad \text{Equation 9}$$

Once low level silence is detected, i.e. Sil_Deci=1, subframe energy level modifier 226 may further reduce the initial gain by applying the following gain factor (gain), as shown below:

gain=k1*(Level_in_sm/1024)+(1−k1);  Equation 10, where 0<=gain<=1, and k1 (0=<k1<=1) is a function of parcor0, and:

k1=(512./32768)−parcor0;

if (k1>(2047/32768))
  k1=(2047/32768);
  k1=k1/(2047/32768);

Lastly, subframe energy level modifier 226 will apply a gain adjustment to the post-filtered signal, as follows, where g_sm is the smoothed gain:

```
if ( Sil_Deci==1 ) {
    g0 = g0 * gain
    for (i=0; i<Lsub;i++) {
        g_sm = g_sm*0.95 + g0*0.05;
        sig_out(i) = sig_out(i)*g_sm;
    }
}
```

In other words, sig_out is modified by multiplying sig_out for each of the plurality of outgoing samples by a smoothed gain (g_sm), wherein g_sm is obtained using iterations from 0 to n−1 of (previous g_sm*0.95+g0*0.05), where n is the number of samples or the subframe size, and previous g_sm is zero (0) prior to the first iteration.

In a preferred embodiment of the present invention, the above-described silence gain reduction is only performed for the narrowband (0-4 KHz) speech signal in the decoder, but not for the wideband (4-8 KHz) speech signal. However, other embodiments of the present invention may include encoder and/or wideband implementations. Further, when a transition from/to narrowband speech signal to/from wideband speech signal is detected, the gain may be gradually changed or adjusted rather than an abrupt application (transition from wideband to narrowband) or non-application (transition from narrowband to wideband) of the gain for reducing effects of the artifacts in the silence areas, where switching between narrowband and wideband is further described in U.S. Patent Application Ser. No. 60/784,384, filed Mar. 20, 2006, entitled "Seamless Speech Band Transition and Pitch Track Smoothing," which is hereby incorporated by reference in its entirety.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. For example, it is contemplated that the circuitry disclosed herein can be implemented in software, or vice versa. The described embodiments are to be considered in all respects as illustrative and not restrictive. It should also be understood that the invention is not limited to the particular embodiments described herein, but is capable of many rearrangements, modifications, and substitutions without departing from the scope of the invention.

APPENDIX A

```
/*****************************************************************/
/*****************************************************************/
/*                    Fixed-Point Silence Cleaning              */
/*****************************************************************/
/*****************************************************************/
Word16 Level_in_sm=1024; /* temporaly put this varible here */
Word16 PostNB=0; /* temporaly set to 0; real value : 0<=PostNB<=1 */
/*-------------------------------------------------------------
 * G729EV_G729_scale_st - control of the subframe gain
 * gain[n] = G729EV_G729_AGC_FAC * gain[n-1] + (1 - AGC_FAC) g_in/g_out
 *-------------------------------------------------------------
 */
static void G729EV_G729_scale_st(Word16 *sig_in, /* input : postfilter input signal */
            Word16 *sig_out, /* in/out: postfilter output signal */
            Word16 *gain_prec, /* in/out: last value of gain for subframe */
#ifdef SILENCE_CLEANING
            Word16 parcor0,
            Word16 PostNB,
            Word32 *Level_in_sm
#endif
            )
{
    Word32   L_acc, L_temp;
    Word16   i;
    Word16   scal_in, scal_out;
    Word16   s_g_in, s_g_out, temp, sh_g0, g0;
#ifdef SILENCE_CLEANING
    Word16   gain;
    Word16   Cond;
#endif
        /* compute input gain */
        L_acc = 0L;
#ifdef WMOPS
        move32( );
#endif
        for (i = 0; i < G729EV_G729_L_SUBFR; i++)
        {
            L_temp = L_abs(L_deposit_l(sig_in[i]));
            L_acc = L_add(L_acc, L_temp);
        }
    #ifdef SILENCE_CLEANING
    /* Smooth level */
    *Level_in_sm=L_add(L_shr(*Level_in_sm, 1), L_shr(*Level_in_sm, 2));
    *Level_in_sm=L_add(*Level_in_sm, L_shr(L_acc, 2));
        /* Detect silence*/
```

APPENDIX A-continued

```
        Cond = (*Level_in_sm<1024) && (L_acc<L_shl(*Level_in_sm, 1)) && (parcor0<512);
        /* If silence is detected, replace the original level with smoothed level*/
        if (Cond == 1)
            L_acc = *Level_in_sm;
#endif
#ifdef WMOPS
        test( );
#endif
        if (L_acc == 0L)
        {
            g0 = 0;
#ifdef WMOPS
            move16( );
#endif
        }
        else
        {
            scal_in = norm_l(L_acc);
            L_acc = L_shl(L_acc, scal_in);
            s_g_in = extract_h(L_acc); /* normalized */
            /* Compute output gain */
            L_acc = 0L;
#ifdef WMOPS
            move32( );
#endif
            for (i = 0; i < G729EV_G729_L_SUBFR; i++)
            {
                L_temp = L_abs(L_deposit_l(sig_out[i]));
                L_acc = L_add(L_acc, L_temp);
            }
#ifdef WMOPS
            test( );
#endif
            if (L_acc == 0L)
            {
                *gain_prec = 0;
#ifdef WMOPS
                move16( );
#endif
                return;
            }
            scal_out = norm_l(L_acc);
            L_acc = L_shl(L_acc, scal_out);
            s_g_out = extract_h(L_acc); /* normalized */
            sh_g0 = add(scal_in, 1);
            sh_g0 = sub(sh_g0, scal_out); /* scal_in – scal_out + 1 */
#ifdef WMOPS
            test( );
#endif
            if (sub(s_g_in, s_g_out) < 0)
            {
                g0 = div_s(s_g_in, s_g_out); /* s_g_in/s_g_out in Q15 */
            }
            else
            {
                temp = sub(s_g_in, s_g_out); /* sufficient since normalized */
                g0 = shr(div_s(temp, s_g_out), 1);
                g0 = add(g0, (Word16) 0x4000); /* s_g_in/s_g_out in Q14 */
                sh_g0 = sub(sh_g0, 1);
            }
            /* L_gain_in/L_gain_out in Q14     */
            /* overflows if L_gain_in > 2 * L_gain_out */
            g0 = shr(g0, sh_g0); /* sh_g0 may be >0, <0, or =0 */
#ifdef SILENCE_CLEANING
        if ( Cond==1 )
            { /* Apply a gain reduction for silence; the gain is defined as
                gain = (Level_in_sm/MAX_SILENCE_LEVEL)*k1 + (1–k1);
                k1 (0=<k1<=1) is a function of PARCOR0 */
                /* k1 in Q15*/
                temp=sub(512, parcor0);
                if (temp>2047) temp=2047;
                temp=shl(temp, 4);
                /* gain = (Level_in_sm/MAX_SILENCE_LEVEL) in Q15 */
                if (*Level_in_sm>1023) gain = 1023;
                else gain = extract_l(*Level_in_sm);
                gain = shl(gain, 5);
                /* gain = gain*k1 + 1–k1*/
                gain = mult_r(gain, temp);
                gain = add(gain, sub(32767, temp));
                gain = mult_r(gain, sub(32767, PostNB));
```

APPENDIX A-continued

```
            gain = add(gain, PostNB);
            g0 = mult_r(g0, gain);
        }
#endif
        g0 = mult_r(g0, G729EV_G729_AGC_FAC1);    /* L_gain_in/L_gain_out * AGC_FAC1 */
    }
    /* gain(n) = G729EV_G729_AGC_FAC gain(n-1) + G729EV_G729_AGC_FAC1 gain_in/gain_out    */
    /* sig_out(n) = gain(n) sig_out(n)                      */
    gain = *gain_prec;
    for (i = 0; i < G729EV_G729_L_SUBFR; i++)
    {
        temp = mult_r(G729EV_G729_AGC_FAC, gain);
        gain = add(temp, g0);       /* in Q14 */
        L_temp = L_mult(gain, sig_out[i]);
        L_temp = L_shl(L_temp, 1);
        sig_out[i] = round(L_temp);
    }
    *gain_prec = gain;
#ifdef WMOPS
    move16( );
    move16( );
#endif
    return;
}
```

APPENDIX B

```
/********************************************************************/
/********************************************************************/
/*                    Floating-Point Silence Cleaning               */
/********************************************************************/
/********************************************************************/
REAL Level_in_sm=1024.; /* temporaly put this varible here */
REAL PostNB=0.; /* temporaly set to 0; real value: 0<=PostNB<=1 */
/**--------------------------------------------------------------------
 *  Function G729EV_G729_scale_st - control of the subframe gain
 *      gain[n] = G729EV_G729_AGC_FAC * gain[n-1] + (1 - G729EV_G729_AGC_FAC) g_in/g_out
 *---------------------------------------------------------------------
 */
void
G729EV_G729_scale_st (REAL *sig_in,         /**< input : postfilter input signal */
            REAL *sig_out,      /**< in/out: postfilter output signal */
            REAL *gain_prec     /**< in/out: last value of gain for subframe */
#ifdef SILENCE_CLEANING
            ,
                REAL parcor0,
                REAL PostNB,
                REAL *Level_in_sm
#endif
            )
{
    int i;
    REAL gain_in, gain_out;
    REAL g0, gain;
#ifdef SILENCE_CLEANING
    short Cond;
    REAL k1;
#endif
    /* compute input gain */
    gain_in = (REAL) 0.;
    for (i = 0; i < G729EV_G729_L_SUBFR; i++)
    {
        gain_in += (REAL) fabs (sig_in[i]);
    }
#ifdef SILENCE_CLEANING
    /* Smooth level */
    *Level_in_sm = 0.75*(*Level_in_sm) + 0.25*gain_in;
    /* Detect silence*/
    Cond = (*Level_in_sm < 1024.) && (gain_in < *Level_in_sm*2.) && (parcor0<512./32768);
    /* If silence is detected, replace the original level with smoothed level*/
    if (Cond == 1)
        gain_in = *Level_in_sm;
#endif
```

APPENDIX B-continued

```
if (gain_in == (REAL) 0.)
    {
        g0 = (REAL) 0.;
    }
else
    {
        /* Compute output gain */
        gain_out = (REAL) 0.;
        for (i = 0; i < G729EV_G729_L_SUBFR i++)
        {
            gain_out += (REAL) fabs (sig_out[i]);
        }
        if (gain_out == (REAL) 0.)
        {
            *gain_prec = (REAL) 0.;
            return;
        }
        g0 = gain_in / gain_out;
#ifdef SILENCE_CLEANING
        if ( Cond==1 )
            { /* Apply a gain reduction for silence; the gain is defined as
                  gain = (Level_in_sm/MAX_SILENCE_LEVEL)*k1 + (1-k1);
                  k1 (0=<k1<=1) is a function of PARCOR0 */
                /*k1*/
                k1=(512./32768) - parcor0;
                if (k1>(2047./32768)) k1= (2047./32768);
                k1 /= (2047./32768);
                /* gain = (Level_in_sm/MAX_SILENCE_LEVEL)*/
                if (*Level_in_sm>1023) gain = 1.;
                else gain = *Level_in_sm/1024.;
                gain = gain*k1 + 1-k1;
                gain = gain *(1.-PostNB) + PostNB;
                g0 *= gain;
            }
#endif
        g0 *= G729EV_G729_AGC_FAC1;
    }
    /*   compute   gain(n)   =   G729EV_G729_AGC_FAC   gain(n-1)   +   (1-
G729EV_G729_AGC_FAC)gain_in/gain_out */
    /* sig_out(n) = gain(n) sig_out(n)                *  /
    gain = *gain_prec;
    for (i = 0; i < G729EV_G729_L_SUBFR; i++)
    {
        gain *= G729EV_G729_AGC_FAC;
        gain += g0;
        sig_out[i] *= gain;
    }
    *gain_prec = gain;
    return;
}
```

What is claimed is:

1. A method of reducing effect of noise producing artifacts in a speech signal, the method comprising:
    obtaining a plurality of incoming samples representative of a speech subframe;
    summing an energy level for each of the plurality of samples to generate a total input level;
    determining whether the speech subframe is in a silence area using the total input level;
    setting a gain value as a function of the total input level in response to determining that the speech subframe is in the silence area, wherein the function results in the gain value increasing as the total input value increases and the gain value decreasing as the total input value decreases;
    multiplying the plurality of samples representative of the speech subframe by the gain value to produce modified samples;
    generating a digital speech signal using the modified samples; and
    converting, using a digital-to-analog converter (DAC), the digital speech signal into an analog signal.

2. The method of claim 1, wherein the function includes the total input level divided by a predetermined threshold.

3. The method of claim 1, wherein the summing sums an absolute value of the energy level for each of the plurality of samples to generate the total input level.

4. The method of claim 1, wherein the method is performed by a speech decoding system.

5. The method of claim 1, wherein the method is performed by a speech encoding system.

6. The method of claim 1 further comprising:
    determining whether the digital speech signal is a narrowband signal (0-4 KHz) or a wideband signal (4-8 KHz); and
    performing the generating the digital speech signal using the modified samples only if the determining determines that the digital speech signal is the narrowband signal.

7. The method of claim 1 further comprising:
    detecting a transition of the digital speech signal between a narrowband signal (0-4 KHz) or a wideband signal (4-8 KHz); and
    gradually changing the gain value based on the transition.

8. A speech decoding system for reducing effect of noise producing artifacts in silence areas of a speech signal, the speech decoding system comprising:

a digital-to-analog converter (DAC);
wherein the speech decoding system is configured to:
obtain a plurality of incoming samples representative of a speech subframe;
sum an energy level for each of the plurality of samples to generate a total input level;
determine whether the speech subframe is in a silence area using the total input level;
set a gain value as a function of the total input level in response to determining that the speech subframe is in the silence area, wherein the function results in the gain value increasing as the total input value increases and the gain value decreasing as the total input value decreases;
multiply the plurality of samples representative of the speech subframe by the gain value to produce modified samples; and
generate a digital speech signal using the modified samples;
wherein the DAC is configured to convert the digital speech signal into an analog signal.

9. The speech decoding system of claim 8, wherein the function includes the total input level divided by a predetermined threshold.

10. The speech decoding system of claim 8, wherein the speech decoding system is configured to sum an absolute value of the energy level for each of the plurality of samples to generate the total input level.

11. The speech decoding system of claim 8, wherein the speech decoding system is further configured to:
determine whether the digital speech signal is a narrowband signal (0-4 KHz) or a wideband signal (4-8 KHz); and
generate the digital speech signal using the modified samples only if the determining determines that the digital speech signal is the narrowband signal.

12. The further comprising of claim 8, wherein the speech decoding system is further configured to:
detect a transition of the digital speech signal between a narrowband signal (0-4 KHz) or a wideband signal (4-8 KHz); and
gradually change the gain value based on the transition.

13. A method of reducing effect of noise producing artifacts in silence areas of a speech signal for use by a speech decoding system, the method comprising:
obtaining a plurality of incoming samples of a speech subframe;
summing an absolute value of an energy level for each of the plurality of incoming samples to generate a total input level (gain_in);
smoothing the total input level to generate a smoothed level (Level_in_sm);
determining whether the speech subframe is in a silence area based on the total input level, the smoothed level and the first reflection coefficient (parcor0), using:
(Level _in _sm<1024) && (gain_in<2*Level _in_sm)&& (parcor0 <512/32768);
defining a gain in response to determining that the speech subframe is in the silence area;
modifying an energy level of the speech subframe using the gain to produce a modified speech subframe;
generating a digital speech signal using the modified speech subframe; and
converting, using a digital-to-analog converter (DAC), the digital speech signal into an analog signal.

14. The method of claim 13, wherein the smoothing is performed using: Level_in_sm=0.75*Level_in_sm +0.25*gain _in.

15. The method of claim 13 further comprising:
assigning Level_in_sm to gain_in (gain_in=Level _in_sm) if Level_in_sm<gain_in.

16. The method of claim 15 further comprising:
summing an absolute value of an energy level for each of the plurality of outgoing samples, prior to the modifying, to generate a total output level (gain_out);
determining an initial gain using (gain_in/gain_out); and
modifying the gain using the initial gain to generate a modified gain (g0).

17. The method of claim 16, wherein the modifying the gain comprises multiplying an outgoing signal (sig_out) for each of the plurality of outgoing samples by a smoothed gain (g_sm), wherein g_sm is obtained using iterations from 0 to n-1 of (previous g_sm*0.95+g0*0.05), where n is the number of samples, and previous g_sm is zero (0) prior to the first iteration.

18. A speech decoding system for reducing effect of noise producing artifacts in silence areas of a speech signal, the speech decoding system comprising:
a digital-to-analog converter (DAC);
wherein the speech decoding system is configured to:
obtain a plurality of incoming samples of a speech subframe;
sum an absolute value of an energy level for each of the plurality of incoming samples to generate a total input level (gain_in);
smooth the total input level to generate a smoothed level (Level_in_sm);
determine whether the speech subframe is in a silence area based on the total input level, the smoothed level and the first reflection coefficient (parcor0), using:
(Level_in_sm<1024) && (gain_in<2*Level_in_sm)&& (parcor0<512/32768);
define a gain in response to determining that the speech subframe is in the silence area;
modify an energy level of the speech subframe using the gain to produce a modified speech subframe; and
generate a digital speech signal using the modified speech subframe;
wherein the DAC is configured to convert the digital speech signal into an analog signal.

19. The speech decoding system of claim 18, wherein smoothing the total input level is performed using: Level_in_sm=0.75*Level_in_sm+0.25*gain_in.

20. The speech decoding system of claim 18, wherein the speech decoding system is further configured to:
assign Level_in_sm to gain_in (gain_in=Level_in_sm) if Level_in_sm<gain_in.

21. The speech decoding system of claim 20, wherein the speech decoding system is further configured to:
sum an absolute value of an energy level for each of the plurality of outgoing samples, prior to the modifying, to generate a total output level (gain_out);
determine an initial gain using (gain_in/gain_out); and
modify the gain using the initial gain to generate a modified gain (g0).

22. The speech decoding system of claim 21, wherein modifying the gain comprises multiplying an outgoing signal (sig_out) for each of the plurality of outgoing samples by a smoothed gain (g_sm), wherein g_sm is obtained using iterations from 0 to n-1 of (previous g_sm*0.95+g0*0.05), where n is the number of samples, and previous g_sm is zero (0) prior to the first iteration.

23. A method of reducing effect of noise producing artifacts in silence areas of a speech signal for use by a speech decoding system, the method comprising:
  obtaining a plurality of incoming samples of a speech subframe;
  summing an absolute value of an energy level for each of the plurality of incoming samples to generate a total input level (gain_in);
  smoothing the total input level to generate a smoothed level (Level_in_sm);
  determining that the speech subframe is in a silence area based on the total input level, the smoothed level and a spectral tilt parameter;
  defining a gain using k1*(Level_in_sm/1024)+(1-k1 ), where k1 is a function of the spectral tilt parameter;
  modifying an energy level of the speech subframe using the gain to produce a modified speech subframe;
  generating a digital speech signal using the modified speech subframe; and
  converting, using a digital-to-analog converter (DAC), the digital speech signal into an analog signal.

24. The method of claim 23, wherein the smoothing is performed using: Level_in_sm=0.75*Level_in_sm+0.25*gain _in.

25. The method of claim 23, wherein the determining uses the first reflection coefficient (parcor0), and the determining is performed using:
  (Level_in_sm<1024) && (gain_in<2*Level_in_sm)&& (parcor0<512/32768).

26. The method of claim 23 further comprising:
  assigning Level_in_sm to gain_in (gain_in=Level _in_sm) if Level_in_sm<gain_in.

27. The method of claim 26 comprising:
  summing an absolute value of an energy level for each of the plurality of outgoing samples, prior to the modifying, to generate a total output level (gain_out);
  determining an initial gain using (gain_in/gain_out); and
  modifying the gain using the initial gain to generate a modified gain (g0).

28. The method of claim 27, wherein the modifying the gain comprises multiplying an outgoing signal (sig_out) for each of the plurality of outgoing samples by a smoothed gain (g_sm), wherein g_sm is obtained using iterations from 0 to n-1 of (previous g_sm*0.95+g0*0.05), where n is the number of samples, and previous g_sm is zero (0) prior to the first iteration.

29. A speech decoding system for reducing effect of noise producing artifacts in silence areas of a speech signal, the speech decoding system comprising:
  a subframe energy level calculator configured to obtain a plurality of incoming samples of a speech subframe, and configured to sum an absolute value of an energy level for each of the plurality of incoming samples to generate a total input level (gain_in), and further configured to smooth the total input level to generate a smoothed level (Level_in_sm);
  a subframe energy level comparator configured to determine that the speech subframe is in a silence area based on the total input level, the smoothed level and a spectral tilt parameter;
  a subframe energy level modifier configured to define a gain using k1*(Level_in_sm/1024)+(1-k1), where k1 is a function of the spectral tilt parameter, and further configured to modify an energy level of the speech subframe using the gain to produce a modified speech subframe;
  an output for generating a digital speech signal using the modified speech subframe; and
  a digital-to-analog converter configured to convert the digital speech signal into an analog signal.

30. The speech coding system of claim 29, wherein the subframe energy level calculator smoothes total input level using:
  Level_in_sm=0.75*Level_in_sm+0.25*gain _in.

31. The speech coding system of claim 29, wherein the subframe energy level comparator uses the first reflection coefficient (parcor0) and determines that the speech subframe is in the silence area using:
  (Level_in_sm<1024) && (gain_in<2*Level_in_sm)&& (parcor0<512/32768).

32. The speech coding system of claim 29, wherein subframe energy level modifier assigns Level_in_sm to gain_in (gain_in=Level_in_sm) if Level_$_{in}$_sm<gain_in.

33. The speech coding system of claim 32, wherein subframe energy level calculator is further configured to sum an absolute value of an energy level for each of the plurality of outgoing samples, prior to modification by the subframe energy level modifier, to generate a total output level (gain_out), and the subframe energy level modifier is further configured to determine an initial gain using (gain_in/gain_out) and modify the gain using the initial gain to generate a modified gain (g0).

34. The speech coding system of claim 33, wherein the subframe energy level modifier modifies the speech subframe energy level by multiplying an outgoing signal (sig_out) for each of the plurality of outgoing samples by a smoothed gain (g_sm), wherein g_sm is obtained using iterations from 0 to n-1 of (previous g_sm*0.95+g0*0.05), where n is the number of samples, and previous g_sm is zero (0) prior to the first iteration.

* * * * *